REFLEX AMPLIFIER CIRCUIT WHICH EFFECTIVELY ELIMINATES AUDIO FEEDTHROUGH

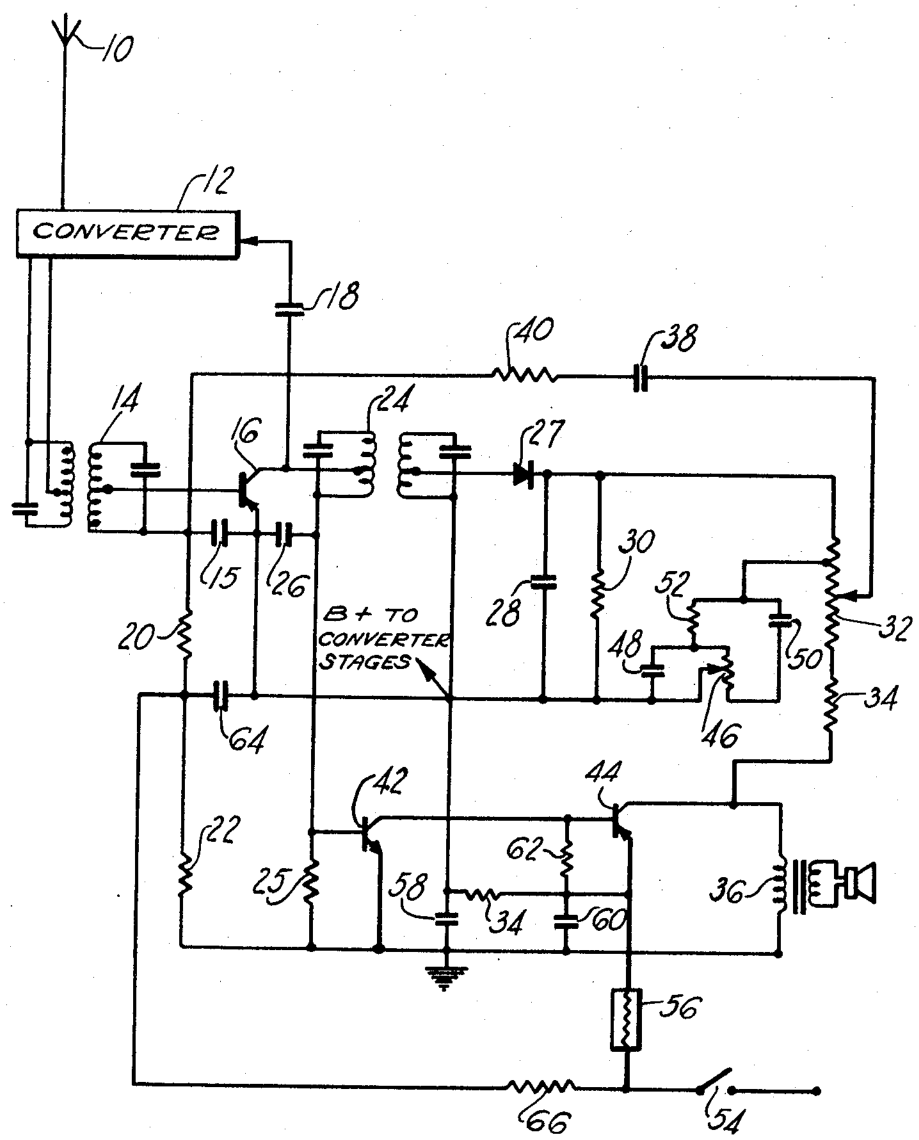
INVENTORS
MICHAEL SLAVIN
CARLOS A.B. CARVALHO
BY
Killman, Smith & Lamb
ATTORNEYS 3,316,489

Michael Slavin, Baltimore, Md., and Carlos A. B. Carvalho, Campinas, Sao Paulo, Brazil, assignors to The Bendix Corporation, Baltimore, Md., a corporation of Delaware Filed Aug. 16, 1963, Ser. No. 302,552
4 Claims. (Cl. 325—486)

The present invention relates to radio receivers and more particularly to an improvement in signal translating circuits for radio receiving apparatus.

In the design of broadcast receivers and the like, it is frequently desirable to employ a reflex or signal translating circuit in which one or more stages act both as an amplifier for an audio signal modulated intermediate frequency carrier wave and as an amplifier for the demodulated audio signal. In conventional reflex circuit arrangements, the modulated intermediate frequency output of the radio frequency converter is coupled to an intermediate frequency amplifier, the output of which is coupled to the input of the reflex stage. Here the amplified modulated intermediate frequency is further amplified and applied through suitable coupling means to a modulation detector. The audio frequency demodulation products are then coupled back to the input circuit of the reflex amplifying stage and are further amplified and applied through a second coupling means or low frequency load impedance to the input of an audio frequency amplifier. Such signal translating circuits thus achieve double amplification with the use of a single active amplifying element. A source of difficulty, however, has manifested itself in that the reflex stage and previous stages inevitably accomplish some audio detection which is applied to the audio amplifier without passing through the volume control potentiometer. This audio "feed through" is, of course, undesirable. Aside from the annoyance caused by inability to shut off the audio at the minimum volume position of the volume control potentiometer, great distortion may be present because the fundamental frequencies are cancelled out between the normal signal and the out-of-phase "feed through" signal.

It is, therefore, an object of the present invention to provide an improved radio receiver having a reflex amplifying stage in which the disadvantages of the typical audio "feed through" problem are effectively eliminated.

Another object of the present invention is to provide an improved reflex radio receiver having a single reflex amplifying stage and one or more audio frequency amplifying stages suitable for operation in an automotive vehicle or the like, wherein undesirable alternating current components are associated with the source of power.

It is another object of the present invention to provide a reflex radio receiver meeting the above objectives and in which a satisfactory tone control arrangement can be provided.

A further object of the present invention is to provide a unique automatic gain control arrangement in a reflex receiver.

It is a still further object of the present invention to provide a signal translating circuit requiring a minimum of expensive active elements to produce the desired amplification.

Other objects and advantages of this invention will best be understood from the following description when read in connection with the accompanying drawing in which there is shown a schematic circuit diagram of a radio receiver including a signal translating circuit in accordance with the invention.

Referring now to the drawing, audio frequency modulated radio waves are picked up by an antenna 10 and are converted to audio frequency modulated intermediate frequency carrier waves by a conventional frequency converter 12 which may include a tuned radio frequency amplifier stage. The modulated intermediate frequency output of the converter 12 is coupled through an intermediate frequency tuned transformer 14 directly to the base and through a "bootstrap" capacitor 15 to the emitter electrode of a first transistor amplifier stage 16 whose collector electrode is coupled through a capacitor 18 to the converter 12 for automatic gain control. Resistors 20 and 22 provide the proper bias voltages for the base and emitter of transistor amplifier stage 16.

The output of the first or reflex amplifier stage 16 is coupled to one of the primary winding terminals of an intermediate frequency tuned coupling transformer 24. The other side of this winding is connected through capacitor 26 to the emitter of reflex transistor 16. The output of transformer 24 is taken from terminals on the secondary winding and applied to a diode detector 27, where a capacitor 28 and a resistor 30 are paralleled to form the audio load impedance. A potentiometer 32, which serves as a manually variable feedback resistor and volume control, and a feedback limiting resistor 34 are connected between the detector side of the audio load resistor 30 and a transducer driving load impedance 36. The slider of potentiometer 32 is connected through a direct current blocking capacitor 38 and an intermediate frequency isolating resistor 40 to the base circuit of transistor amplifier stage 16. The audio signal thus returned to the input of reflex transistor stage 16 is further amplified and fed through the primary winding of transformer 24 to the input of transistor amplifier stage 42. The output of transistor 42 is directly coupled to the input of transistor amplifier stage 44 for still further amplification before being applied to load impedance 36. A resistor 25 provides proper bias for the base of transistor 42.

Tone control is provided by a potentiometer 46, capacitors 48 and 50, and resistor 52 arranged as shown in parallel with audio load resistor 30 and a portion of potentiometer 32.

Power for the circuit is supplied from a source, not shown, through suitable switching means 54 to a resistive element 56 having a positive temperature coefficient and which is of the self-heating type for providing compensation for voltage variations in the source. Additional filtering is supplied by means of capacitors 58 and 60 and resistor 34 to provide a heavily filtered direct current voltage to the emitter of transistor amplifier stage 16. Capacitor 64 and resistor 66 function to prevent ripple from the unfiltered power line from appearing in the base-emitter circuit of stage 16.

In operation, an audio frequency modulated radio frequency signal received at antenna 10 will be converted to an audio frequency modulated intermediate frequency carrier in the converter 12 and this signal is coupled through transformer 14 to the reflex stage 16, where it is amplified. The audio frequency signal appears at the output of detector diode 27 and is supplied across the tone control circuit and the volume control and feedback potentiometer 32. As the slider of potentiometer 32 is moved upwardly (toward diode 27) the proportion of the amount of the audio signal from diode 27 is increased and the audio output is increased. With the opposite end of potentiometer 32 effectively connected to the signal from the collector of transistor 44 which is opposite in phase to the output of diode 27, movement of the slider in the opposite direction produces an increasing amount of negative feedback to the base of stage 16 which reduces the audio output. With maximum negative feedback selected, any audio signal appearing at the base of transistor stage 16 may be completely bucked out. By opposing the audio component at this point, this arrangement effectively prevents any undesirable audio signals from reaching the transistor 42, and hence, from appearing at the speaker.

The novel features of the present invention are set forth with particularity in the appended claims. It is to be understood, however, that the present invention is described only with reference to a certain preferred embodiment thereof, and that various modifications, combinations, and other embodiments thereof within the scope of the invention will occur to those skilled in the art.

The invention claimed is:

1. In a radio frequency receiver having a sound transducer, a source of direct current power, a source of audio frequency modulated intermediate frequency oscillations, a plurality of direct coupled transistor amplifier stages for amplification of said audio frequency signal without reversing the phase of said audio signal at the output of said audio amplifier stages with respect to the input of said stages, a first amplifier stage including a transistor having base, emitter, and collector electrodes for the simultaneous amplification and phase reversal of intermediate and audio frequency oscillations, said base electrode being connected to receive said modulated intermediate frequency oscillations, detector means for demodulation of said amplified modulated intermediate frequency oscillations, and a tuned coupling transformer having a primary winding connected to the collector and emitter electrodes of said first amplifier stage, and a secondary winding connected to said detector means; volume control means comprising, a potentiometer having first and second terminals and a slider, said first terminal being connected to the output of said detector means, and said second terminal being effectively connected to said transducer;

an intermediate frequency isolating resistor and a direct current blocking capacitor connected in series between the base circuit of said transistor of said first amplifier stage and said slider, and means for coupling said primary winding of said transformer to the first of said plurality of amplifier stages, the output of the final stage being connected to said second terminal of said potentiometer, whereby output of said detector means is applied in opposite phases to said first and second terminals of said potentiometer.

2. A radio frequency receiver substantially as set forth in claim 1 wherein collector electrode of said first transistor is coupled to said source of modulated intermediate frequency oscillations for automatic gain control.

3. A radio frequency receiver substantially as set forth in claim 1 wherein said second terminal of said potentiometer is connected to said transducer through a resistive element for the limiting of said audio frequency feedback.

4. A transistorized reflex radio receiver as set forth in claim 1 wherein a tone control circuit is connected between a tap on said potentiometer and one side of the output of said detector means.

References Cited by the Examiner

UNITED STATES PATENTS

| | | | |
|---|---|---|---|
| 3,138,756 | 6/1964 | Tarantur | 325—486 |
| 3,144,611 | 7/1964 | Kleinman et al. | 325—486 |

OTHER REFERENCES

Waring, J.: How To Design Reflexed Transistor Receivers in Electronics, May 8, 1959, p. 70–71.

KATHLEEN H. CLAFFY, *Primary Examiner.*

A. H. GESS, *Assistant Examiner.*